United States Patent
Phan et al.

(10) Patent No.: US 6,251,570 B1
(45) Date of Patent: Jun. 26, 2001

(54) RESIST DEVELOPER SAVING SYSTEM USING MATERIAL TO REDUCE SURFACE TENSION AND WET RESIST SURFACE

(75) Inventors: Khoi A. Phan; Ramkumar Subramanian, both of San Jose; Bharath Rangarajan, Santa Clara; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/604,372

(22) Filed: Jun. 27, 2000

Related U.S. Application Data

(62) Division of application No. 09/494,699, filed on Jan. 31, 2000, now Pat. No. 6,136,514.

(51) Int. Cl.$^7$ .................................................. G03F 7/32
(52) U.S. Cl. ........................................... 430/327; 430/423
(58) Field of Search ....................................... 430/327, 423

(56) References Cited

U.S. PATENT DOCUMENTS

| | | | |
|---|---|---|---|
| 4,610,953 | 9/1986 | Hashimoto et al. | 430/331 |
| 4,670,372 | 6/1987 | Lewis et al. | 430/326 |
| 4,710,449 | 12/1987 | Lewis et al. | 430/326 |
| 5,206,107 | 4/1993 | Pearlstine | 430/115 |
| 5,254,427 | 10/1993 | Lane et al. | 430/137 |
| 5,821,036 | * 10/1998 | Fiener et al. | 430/326 |
| 5,849,467 | 12/1998 | Sato et al. | 430/331 |
| 6,007,970 | 12/1999 | Ohmi et al. | 430/331 |

\* cited by examiner

*Primary Examiner*—Hoa Van Le
(74) *Attorney, Agent, or Firm*—Amin & Turocy, LLP

(57) ABSTRACT

In one embodiment, the present invention relates to a method of processing a semiconductor structure including a resist thereon, involving the steps of exposing the semiconductor structure including the resist to acting radiation; contacting the semiconductor structure including the exposed resist with a solution comprising water and from about 0.01% to about 5% by weight of a surfactant; and developing the resist with a developer.

16 Claims, No Drawings

RESIST DEVELOPER SAVING SYSTEM USING MATERIAL TO REDUCE SURFACE TENSION AND WET RESIST SURFACE

This application is a div of ser No. 09/494/699 abd. Jan. 31, 2000, now U.S. Pat. No. 6,136,514.

TECHNICAL FIELD

The present invention generally relates to improving the development of a photoresist. In particular, the present invention relates to improving resolution while reducing the amount of developer required to treat the photoresist.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. Since numerous conductive features are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the photoresist.

The photoresist coated substrate is baked to evaporate any solvent in the photoresist composition and to fix the photoresist coating onto the substrate. The baked coated surface of the substrate is next subjected to selective radiation; that is, an image-wise exposure to radiation. This radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist. Many developer solutions contain water and an active compound, such as water and a hydroxide compound.

Development is a critical step in photolithography. This is because poor development decreases resolution, precise pattern formation and/or the quality of subsequent processing steps. For example, incomplete development followed by an etching step results in an incompletely etched underlayer, which in the case of an incompletely etched metal layer, may lead to short circuits. Overdevelopment results in mal-formed structures which inhibit the proper function of semiconductor devices.

Poor development is caused by a number of factors. One factor is that microbubbles, present at the photoresist—developer interface, lead to pattern defects because they inhibit uniform attach of the photoresist by the developer. It is desirable for the developer to remove selected portions of the exposed photoresist uniformly across the wafer. Another factor is low wettability of the developer on the photoresist surface, which can lead to underdevelopment of the exposed photoresist, resulting in a poorly resolved pattern. Low wettability is attributable, in part, to the organic characteristics of the photoresist (typically but not always an organic polymeric material) and the aqueous characteristics of the developer (typically but not always an aqueous solution).

Lack of wettability of the developer on the photoresist surface also requires the undesirable use of large amounts of developer. Since increased amounts of developer increase the costs associated with photolithography, it is preferable to employ small amounts of developer (and consequently small amounts of the active developer chemicals), provided that highly resolved photoresist patterns are obtainable.

SUMMARY OF THE INVENTION

The present invention provides an improved developing process for photolithography. The present invention particularly provides methods for at least one of increasing wettability of the developer on the resist surface, reducing the amount of developer required to develop a photoresist covered substrate, and modifying the surface of an exposed resist to increase the quality (resolution, critical dimension control, etc.) of the subsequently patterned resist.

In one embodiment, the present invention relates to a method of processing a semiconductor structure including a resist thereon, involving the steps of exposing the semiconductor structure including the resist to acting radiation; contacting the semiconductor structure including the exposed resist with a solution comprising water and from about 0.01% to about 5% by weight of a surfactant; and developing the resist with a developer.

In another embodiment, the present invention relates to a method of processing a semiconductor structure including a positive photoresist thereon, involving the steps of exposing the semiconductor structure including the positive photoresist to acting radiation; contacting the semiconductor structure including the exposed positive photoresist with a solution comprising deionized water and from about 0.05% to about 3% by weight of a surfactant, wherein the solution has a surface tension of about 60 dynes/cm or less; and developing the positive photoresist with an aqueous developer.

In yet another embodiment, the present invention relates to a method of developing a photoresist on a semiconductor structure, involving the steps of contacting the photoresist on the semiconductor structure with a solution comprising deionized water and from about 0.01% to about 5% by weight of a surfactant for a time from about 2 seconds to about 3 minutes; and developing the photoresist with a developer from about 1 second to about 2 minutes after the solution is contacted with the photoresist on the semiconductor structure.

DISCLOSURE OF INVENTION

The present invention involves improving the development of a photoresist by promoting improved interaction between a developer and resist surfaces. The present invention more specifically involves contactinic the surface of a resist with a resist activating solution prior to or simultaneously with contactinic the surface of a resist with a developer.

During photolithography, a resist, such as an organic photoresist, is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The resist is provided over at least a portion of the substrate, but typically over the entire substrate.

Any resist may be applied to the substrate surface by any suitable means. For example, a 157 nm sensitive photoresist, a 193 nm sensitive photoresist, an I-line, H-line, G-line, E-line, mid UV, deep UV, extreme UV or chemically amplified photoresist material may be spin-coated on the substrate surface. Positive or negative photoresists may be used, but positive photoresists are preferred. Photoresists are commercially available from a number of sources, including Shipley Company, Kodak, Hoechst Celanese Corporation, Clariant, JSR Microelectronics, Hunt, Arch Chemical, Aquamer, and Brewer. The resist is typically applied to any suitable thickness, typically from about 200 Å to about 10,000 Å, although the thickness of the resist is not critical to the invention.

Optionally after the resist is applied to the substrate surface, the resist covered substrate is subjected to a soft bake to drive off excess solvent and/or to increase adhesion with the substrate surface. The soft bake involves heating at an elevated temperature for a suitable period of time. By way of example, the resist covered substrate is typically heated at temperatures above about 60° C. for at least about 10 seconds.

The resist covered substrate is selectively exposed to actinic radiation to cause a chemical transformation in desired regions of the resist. The wavelength of radiation is not critical to the invention, as it depends primarily upon the identity of the resist material. A mask is typically employed to selectively expose the resist.

A resist activating solution is contacted with the exposed and baked resist covered substrate surface to improve the subsequent development of the resist. The resist activating solution contains water and a surfactant. Deionized water is preferred. The resist activating solution functions to promote at least one of: reduce the surface tension of the aqueous developer, wet the surface of the resist, chemically modifies the surface of the resist, and prevent formation and/or adherence of microbubbles during development.

The surfactant contains at least one of a nonionic surfactant, an anionic surfactant, a cationic surfactant, and an amphoteric surfactant. Surfactants are known in the art, and many of these surfactants are described in McCutcheon's "Volume I: Emulsifiers and Detergents", 1995, North American Edition, published by McCutcheon's Division MCP Publishing Corp., Glen Rock, N.J., and in particular, pp. 1–232 which describes a number of anionic, cationic, nonionic and amphoteric surfactants and is hereby incorporated by reference for the disclosure in this regard.

The resist activating solution contains enough surfactant to wet the surface of the resist and/or to lower the surface tension of water by at least about 5%. In another embodiment, the rinsing solution contains enough surfactant to lower the surface tension of water by at least about 10%. In yet another embodiment, the rinsing solution contains enough surfactant to lower the surface tension of water by at least about 20%. In still yet another embodiment, the rinsing solution contains enough surfactant to lower the surface tension of water by at least about 30%. Pure water has a surface tension of 72 dyneslcm. Surface tension is measured by determining the contact angle (the angle the surface of a drop of liquid makes with a solid surface).

In one embodiment, the surface tension of the resist activating solution is about 65 dynes/cm or less. In another embodiment, the surface tension of the resist activating solution is about 60 dynes/cm or less. In yet another embodiment, the surface tension of the resist activating solution is about 55 dynes/cm or less. In still yet another embodiment, the surface tension of the resist activating solution is about 50 dynes/cm or less.

In one embodiment, the resist activating solution contains from about 0.01% to about 5% by weight of a surfactant. In another embodiment, the resist activating solution contains from about 0.05% to about 3% by weight of a surfactant. In yet another embodiment, the resist activating solution contains from about 0.1% to about 2% by weight of a surfactant.

In one embodiment, the surfactant is an alcohol or a polyol (such as diols, triols, and so on). In this embodiment, the surfactant is a compound represented by the formula ROH, wherein R is an alkyl group or an hydroxyalkyl group containing from 1 to about 6 carbon atoms. In a preferred embodiment, R is an alkyl group containing from 1 to about 4 carbon atoms. In a more preferred embodiment, R is an alkyl group containing from about 2 to about 4 carbon atoms. Alcohols are preferred surfactants since they are relatively volatile (more volatile than water) and do not leave any residue after vaporization. Examples of alcohol and polyol surfactants include methanol, ethanol, n-propanol, isopropanol, n-butanol, isobutanol, n-pentanol, isopentanol, hexanol, cyclohexanol, ethylene glycol, propylene glycol and butylene glycol.

In another embodiment, the surfactant is a fluorocarbon based surfactant. Fluorocarbon based surfactants, such as metal or ammonium fluorocarbon sulfonates or carboxylates, are commercially available from the 3M Company under the trade designation "Fluorad" and from DuPont under the trade designation "Zonyl." Specific Fluorad surfactants include potassium fluorinated alkyl carboxylates, ammonium perfluoro alkyl sulfonates, potassium perfluoro alkyl sulfonates, amine perfluoro alkyl sulfonates, and ammonium perfluoro alkyl carboxylates. Fluorocarbon based surfactants include alkali metal, ammonium and amine fluorinated alkyl sulfonates and carboxylates. Specific Fluorad surfactants include those under the designation FC-93, EC-95, FC-98, FC-99, FC-100, FC-109, FC-120, FC-121, FC-129, FC-135 and FC-143. Specific Zonyl surfactants include those under the designation Zonyl FSA, Zonyl FSE, Zonyl FSJ, Zonyl FSP, Zonyl NF, Zonyl RP, Zonyl TBS and Zonyl UR.

In another embodiment, the surfactant is an alkyl sulfate (sulfate of an alcohol). The alkyl group of the alkyl sulfate typically contains from about 8 to about 22 carbon atoms. Alkyl sulfate surfactants include ammonium alkyl sulfates such as ammonium lauryl sulfate, ammonium cetyl sulfate, and ammonium stearyl sulfate. Alkyl sulfates are commercially available under the trade designation Rhodapon, and specifically L-22, and under the trade designation Rhodapex, and specifically CD128 and MA360 from Rhone-Poulenc, under the trade designation Duponol from Witco, under the trade designation Stepanol, and specifically AM and AM-V and under the trade designation Polystep, and specifically B-7 and B-11 from Stepan Company.

The temperature of the resist activating solution is typically from about 10° C. to about 50° C. In one embodiment, the temperature of the resist activating solution is from about 15° C. to about 40° C. In another embodiment, the temperature of the resist activating solution is from about 20° C. to about 30° C. The temperature is maintained to maximize contact and interaction between the resist surface and the resist activating solution, while not substantially damaging or degrading the resist surface or the subsequently developed resist.

The resist activating solution is contacted with the exposed and baked resist covered substrate for a time sufficient for at least one of reducing the surface tension of the aqueous developer, wetting the surface of the resist, chemically modifying the surface of the resist, and preventing formation and/or adherence of microbubbles during development. The time of which the resist activating solution is contacted with the exposed and baked resist covered substrate is typically from about 1 second to about 10 minutes. In another embodiment, the resist activating solution is contacted with the resist covered substrate for a period of time from about 2 seconds to about 3 minutes. In yet another embodiment, the resist activating solution is contacted with the resist covered substrate for a period of time from about 3 seconds to about 1 minute.

The resist activating solution is preferably contacted with the resist immediately prior to development. However, some time may elapse after contact with the resist activating solution and before development. For example, the resist covered substrate may be developed within about one hour after contact with the resist activating solution. Alternatively, contact between the resist and the resist activating solution may occur simultaneously with development. In this embodiment, employment of separate dispensing nozzles is preferred.

In one embodiment, a developer is contacted with the resist from about 0 seconds to about 1 hour after the resist activating solution is contacted with the resist. In another embodiment, a developer is contacted with the resist from about 1 second to about 2 minutes after the resist activating solution is contacted with the resist. In yet another embodiment, a developer is contacted with the resist from about 2 seconds to about 1 minute after the resist activating solution is contacted with the resist.

The resist activating solution leaves a small amount of a residue on the resist surface. While not wishing to be bound by any theory, it is believed the resist activating solution has a relatively low surface tension (compared with pure water) thus enabling the solution to thoroughly wet the resist surfaces, and thereby reduce the amount of developer required to adequately pattern a given resist and eliminate or minimize microbubbles at the resist-developer interface that cause pattern defects. Again, while not wishing to be bound by any theory, it is also believed the resist activating solution chemically modifies the surface of the resist, for example by converting saturated bonds into unsaturated bonds, thereby enabling the developer to more strongly wet the resist surface during development.

The selectively exposed resist is next developed using a suitable aqueous developer. The specific identity of the developer is not critical to the invention, but typically an aqueous alkaline solution is employed. For example, aqueous tetramethylammonium hydroxide is frequently employed as a developer solution. In one embodiment, the aqueous developer also contains a surfactant. In another embodiment, the aqueous developer does not contain a surfactant.

During development, either the exposed portion of the resist (e.g., positive photoresist) or the unexposed portion of the resist (e.g., negative photoresist) is soluble or is solubilized in the developing solution. The portion of the resist that is not substantially soluble in the developing solution remains on the substrate. Development results in a patterned resist over the substrate surface. As a result of using the resist activating solution, in one embodiment, about 5% less developer solution is required to adequately pattern the exposed resist compared to analogous instances (same concentrations, same developer contact time, same temperature, etc.) where the resist activating solution is not employed. In another embodiment, about 10% less developer solution is required to adequately pattern the exposed resist compared to analogous instances where the resist activating solution is not employed. In yet another embodiment, about 20% less developer solution is required to adequately pattern the exposed resist compared to analogous instances where the resist activating solution is not employed.

A rinsing solution is optionally contacted with the patterned resist covered substrate surface to remove substantially all or all of resist any residue (soluble or partially soluble resist residues) on the substrate surface, to neutralize the substrate surface, and to remove substantially all or all developing solution (including developing solution residues) remaining on the substrate surface. The rinsing solution typically contains deionized water.

After the rinsing solution is removed from the substrate, a patterned resist covered substrate surface having high resolution and good critical dimension control is obtained. As a result, subsequent processing of the substrate is facilitated and the quality of devices made is improved.

Although the invention has been shown and described with respect to a certain preferred embodiment or embodiments, it is obvious that equivalent alterations and modifications will occur to to hers skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure including a resist thereon, comprising:
   exposing the semiconductor structure including the resist to actinic radiation;
   contactinic the semiconductor structure including the exposed resist with a solution comprising water and from about 0.01% to about 5% by weight of an alkyl sulfate surfactant; and
   developing the resist with a developer.

2. The method of claim 1, wherein the semiconductor structure including the exposed resist is contacted with the solution for a time from about 1 second to about 10 minutes.

3. The method of claim 1, wherein the resist is developed from about 0 seconds to about 1 hour after the semiconductor structure including the exposed resist is contacted with the solution.

4. The method of claim 1, wherein the solution comprises from about 0.1% to about 2% by weight of a surfactant.

5. The method of claim 1, wherein the solution has a temperature from about 15° C. to about 50° C.

6. The method of claim 1, wherein about 10% less aqueous developer is required to develop the resist compared to analogous instances where the solution is not employed.

7. The method of claim 1, wherein the resist is developed with an aqueous developer from about 2 seconds to about 1 minute after the solution is contacted with the semiconductor structure.

8. The method of claim 1 further comprising baking the semiconductor structure including the resist.

9. The method of claim 1, wherein the resist is one of a 157 nm sensitive photoresist, a 193 nm sensitive photoresist, an I-line photoresist, an H-line photoresist, a G-line photoresist, an E-line photoresist, a mid UV photoresist, a deep UV photoresist, and an extreme UV photoresist.

10. A method of processing a semiconductor structure including a resist thereon, comprising:
   exposing the semiconductor structure including the resist to actinic radiation;
   contactinic the semiconductor structure including the exposed resist with a solution comprising water and from about 0.05% to about 3% by weight of an alkyl sulfate surfactant; and
   developing the resist with a developer.

11. The method of claim 10, wherein the semiconductor structure including the exposed resist is contacted with the solution for a time from about 3 seconds to about 1 minute.

12. The method of claim 10, wherein the solution has a temperature from about 15° C. to about 40° C.

13. The method of claim 10, wherein the resist is developed with an aqueous developer from about 2 seconds to about 1 minute after the solution is contacted with the semiconductor structure.

14. A method of processing a semiconductor structure including a resist thereon, comprising:
   exposing the semiconductor structure including the resist to actinic radiation;
   contactinic the semiconductor structure including the exposed resist with a solution comprising water and from about 0.1% to about 2% by weight of an alkyl sulfate surfactant; and
   developing the resist with a developer.

15. The method of claim 14, wherein the semiconductor structure including the exposed resist is contacted with the solution for a time from about 2 seconds to about 3 minutes.

16. The method of claim 14, wherein the resist is one of a 157 nm sensitive photoresist, a 193 nm sensitive photoresist, an I-line photoresist, a mid UV photoresist, a deep UV photoresist, and an extreme UV photoresist.

* * * * *

UNITED STATES PATENT AND TRADEMARK OFFICE
CERTIFICATE OF CORRECTION

PATENT NO. : 6,251,570 B1
DATED : June 26, 2001
INVENTOR(S) : Khoi A. Phan et al.

Page 1 of 1

It is certified that error appears in the above-identified patent and that said Letters Patent is hereby corrected as shown below:

Column 6,
Line 48, please change the word "contactinic" to -- contacting --.

Column 7,
Line 16, please change the word "contactinic" to -- contacting --.

Column 8,
Line 11, please change the word "contactinic" to -- contacting --.

Signed and Sealed this

Twenty-ninth Day of January, 2002

Attest:

JAMES E. ROGAN
Attesting Officer
Director of the United States Patent and Trademark Office